United States Patent
Slocum et al.

[19]

[11] Patent Number: 5,931,048
[45] Date of Patent: Aug. 3, 1999

[54] MANIPULATOR FOR AUTOMATIC TEST EQUIPMENT TEST HEAD

[75] Inventors: Alexander H. Slocum, Concord, N.H.; Carsten A. Hochmuth, Harvard, Mass.; David H. Levy, Cambridge, Mass.; Sepehr Kiani, Watertown, Mass.; R. Ryan Vallance, Somerville, Mass.

[73] Assignee: Aesop, Concord, N.H.

[21] Appl. No.: 08/808,131

[22] Filed: Feb. 28, 1997

Related U.S. Application Data

[63] Continuation of application No. 08/392,647, Feb. 23, 1995, abandoned.

[51] Int. Cl.$^6$ .................................................. G05G 11/00
[52] U.S. Cl. ............................. 74/490.07; 248/178.1; 248/279.1; 74/490.02; 901/16; 414/664; 414/668
[58] Field of Search .................................... 248/662, 664, 248/178.1, 279.1, 287.1; 74/490.01, 490.02, 490.03, 490.04, 490.06, 490.07, 490.08, 490.09; 901/16, 6; 414/620, 663, 664, 668, 672

[56] References Cited

U.S. PATENT DOCUMENTS

| | | | |
|---|---|---|---|
| 3,791,052 | 2/1974 | Van Der Lely | 37/8 |
| 3,819,061 | 6/1974 | Andersson et al. | 214/1 BB |
| 3,826,383 | 7/1974 | Richter | 214/1 BD |
| 3,873,148 | 3/1975 | Kennicuit | 296/28 R |
| 3,916,701 | 11/1975 | Butler | 74/57 |
| 4,062,455 | 12/1977 | Flatau | 214/1 CM |
| 4,076,131 | 2/1978 | Dahlstrom et al. | 214/1 BC |
| 4,112,364 | 9/1978 | Katz | 324/158 |
| 4,132,318 | 1/1979 | Wang et al. | 214/1 BB |
| 4,187,051 | 2/1980 | Kirsch et al. | 414/744 |
| 4,188,166 | 2/1980 | Moreau et al. | 414/735 |
| 4,199,294 | 4/1980 | Streck et al. | 414/739 |
| 4,229,136 | 10/1980 | Paissidi | 414/673 |
| 4,264,266 | 4/1981 | Trecksel | 414/730 |
| 4,273,506 | 6/1981 | Thomson et al. | 414/735 |
| 4,299,529 | 11/1981 | Inaba et al. | 414/590 |
| 4,303,368 | 12/1981 | Dent et al. | 414/590 |
| 4,527,942 | 7/1985 | Smith | 414/590 |
| 4,588,346 | 5/1986 | Smith | 414/673 |
| 4,588,346 | 5/1986 | Smith | 414/673 |
| 4,588,346 | 5/1986 | Smith | 414/673 |

(List continued on next page.)

FOREIGN PATENT DOCUMENTS

| | | |
|---|---|---|
| 260024 | 9/1986 | European Pat. Off. . |
| 342045 | 11/1989 | European Pat. Off. . |
| 526996 | 2/1993 | European Pat. Off. . |
| 699913 | 3/1996 | European Pat. Off. . |
| 2153397 | 10/1971 | Germany . |

OTHER PUBLICATIONS

Supporting Fixture of Cable Which is Attached to Antenna, IBM Technical Disclosure Bulleting. vol. 36 No. 5. May 1993.

*Primary Examiner*—John A. Jeffery
*Assistant Examiner*—David Fenstermacher
*Attorney, Agent, or Firm*—Edmund J. Walsh

[57] ABSTRACT

A manipulator for a test head connected to automatic test equipment through a heavy, inflexible cable. The manipulator includes a telescoping column assembly to which is mounted a vertical member. A cradle holding the test head is mounted to the vertical member. The cable is clamped at the vertical member to reduce the amount of force exerted by the cable on the test head. The cradle includes movable members to allow fine positioning of the test head, while maintaining the test head isolated from cable force. Course motion of the test head may be made by moving portions of the manipulator on the opposite side of the cable clamp from the test head. Precise positioning of the test head relative to a handling device is accomplished through a positioning mechanism at the interface between the test head and the handling device. To allow the positioning mechanism to operate, the manipulator has compliance which allows the test head to be forced into position by the positioning mechanism.

26 Claims, 6 Drawing Sheets

U.S. PATENT DOCUMENTS

| | | | |
|---|---|---|---|
| 4,589,815 | 5/1986 | Smith | 414/590 |
| 4,606,696 | 8/1986 | Slocum | 414/744 R |
| 4,676,002 | 6/1987 | Slocum | 33/1 MP |
| 4,685,661 | 8/1987 | Slocum et al. | 269/20 |
| 4,694,230 | 9/1987 | Slocum et al. | 318/568 |
| 4,695,024 | 9/1987 | Haven | 248/281.1 |
| 4,697,472 | 10/1987 | Hiyane | 74/490.02 |
| 4,705,447 | 11/1987 | Smith | 414/590 |
| 4,715,574 | 12/1987 | Holt et al. | 248/297.1 |
| 4,724,716 | 2/1988 | Kawai | 74/479 |
| 4,742,980 | 5/1988 | Heigl | 248/125 |
| 4,765,668 | 8/1988 | Slocum et al. | 294/88 |
| 4,836,042 | 6/1989 | Slocum | 74/424.8 R |
| 4,857,838 | 8/1989 | Willberg | 324/158 F |
| 4,893,074 | 1/1990 | Holt et al. | 324/158 F |
| 4,943,020 | 7/1990 | Beaucoup et al. | 248/124 |
| 4,973,015 | 11/1990 | Beaucoup et al. | 248/124 |
| 5,001,422 | 3/1991 | Dahlberg et al. | 324/158 F |
| 5,030,869 | 7/1991 | Holt et al. | 324/158 F |
| 5,090,265 | 2/1992 | Slocum | 74/424.8 R |
| 5,091,693 | 2/1992 | Berry et al. | 324/158 F |
| 5,135,196 | 8/1992 | Schehr | 248/324 |
| 5,149,029 | 9/1992 | Smith | 248/124 |
| 5,163,649 | 11/1992 | Schehr | 248/287 |
| 5,241,183 | 8/1993 | Kanai et al. | 248/178.1 |
| 5,241,870 | 9/1993 | Holt | 73/866.5 |
| 5,375,480 | 12/1994 | Nihei et al. | 74/490.02 |
| 5,440,943 | 8/1995 | Holt et al. | 74/89.15 |
| 5,450,766 | 9/1995 | Holt | 73/866.5 |
| 5,555,897 | 9/1996 | Lathrop, Jr. et al. | 128/845 |
| 5,567,386 | 10/1996 | Markin | 422/65 |
| 5,608,334 | 3/1997 | Holt | 324/758 |
| 5,655,869 | 8/1997 | Scheler et al. | 414/222 |
| 5,733,096 | 3/1998 | Van doren et al. | 414/744.3 |
| 5,821,440 | 10/1998 | Khater et al. | 73/866.5 |

MANIPULATOR FOR AUTOMATIC TEST EQUIPMENT TEST HEAD

This application is a continuation of application Ser. No. 08/392,647, filed on Feb. 23, 1995, now abandoned.

This invention relates generally to precisely positioning heavy objects and more specifically to a device for positioning the test head portion of automatic test equipment.

Automatic test equipment is used by manufacturers of semiconductor chips. Semiconductor chips are tested as early as possible in the manufacturing process to avoid the cost of processing defective chips. Generally, the chips are tested while they are still part of the semiconductor wafer on which they are fabricated. To test chips in this form, probes must be placed directly onto the chip because leads through which the chip is normally accessed are not added until the chips are separated from the wafer and packaged.

The probes are attached to a portion of the automatic test equipment called a "test head." The test head is connected through a cable to a mainframe cabinet, which holds a major portion of the electronic circuitry needed to generate and analyze test signals. The test head is supported by a manipulator, which allows the test head to be moved.

To test a chip, the wafer is mounted in a device called a prober. The test head is then moved by a human operator to bring the probes into contact with the chip. The test head is secured in this position, and testing is performed. The process of moving and securing the test head in a position in which electrical contact can be made to the chip is called "docking." Once docked, the prober moves the wafer around to present different chips on the wafer for testing.

Various factors make the docking process extremely difficult. First, the semiconductor chip is very small, on the order of a fraction of a square inch. Hundreds of test signals must often be coupled to the chip. The contact points for these test signals must all fit onto the small chip, requiring them to be very small. The test head must be precisely positioned so that all of the probes line up with all of the contact points.

Achieving precise positioning of the test head is complicated because the test head can weigh hundreds of pounds. The weight is largely caused by the need to position some electronic circuitry as close as possible to the chip being tested. The weight makes it difficult to move the test head. In addition, the test head can put excessive force on the prober, causing the prober to deform. If the prober deforms too much, it is very difficult to achieve precise positioning of the probes relative to the chip in the prober.

A further complicating factor is that the cable connecting the test head to the mainframe cabinet is very heavy and exhibits hysteresis. A cable can weigh hundreds of pounds. The cable weight can create forces on the test head. Because the cable exhibits hysteresis, these forces can change when the cable is moved. Thus, the manipulator must precisely position the test head despite the changing forces.

A further complicating factor is that different probers are often used with the same automatic test equipment. Different probers hold the semiconductor chip in different configurations. The manipulator must be able to position the test head to dock regardless of the type of prober used. Sometimes the test head is positioned horizontally above the prober with the probes facing down. In other instances it is positioned horizontally below the prober with the probes facing up. For other probers, the test head is positioned vertically with the probes facing sideways. Still other probers require the test head to be positioned at some angle between horizontal and vertical.

Various design techniques have been employed to facilitate docking. High precision manufacturing techniques are employed to ensure there is as little slack as possible in the manipulator. Hard stops are built into the manipulator to help it return repeatedly to the same position. Also, the contact area between the prober and the test head is made as large as possible to average out any deflections.

To make positioning easier and to reduce deflection caused by the weight of the test head, counter weight schemes have been proposed such as in U.S Pat. No. 4,973,015 to Beaucoup et al. and in U.S. Pat. Nos. 4,527, 942, 4,705,447, 4,588,346, 4,589,815 and 5,149,029 all to Smith. Also to ameliorate problems caused by the weight of the test head, some manipulators include motors or other drive mechanisms.

To reduce the effect of the weight of the cable, arrangements have been proposed to support the weight of the cable. Such arrangements are shown in U.S. Pat. Nos. 4,893,074 and 5,030,869 to Holt et al.

Despite use of these design techniques, current manipulators can not always easily dock a test head with a prober. Often, two people are needed to handle the test head to get it into position. Even when the test head appears to be docked, numerous adjustments are sometimes needed to make electrical contact to all of the test points on the integrated circuit chip.

SUMMARY OF THE INVENTION

With the foregoing background in mind, it is an object of the invention to provide a manipulator which can accurately and repeatably dock a test head.

It is also an object to provide a manipulator which allows one person to dock a test head.

It is yet another object to provide a manipulator which can be operated in a compliant mode to allow a test head to be precisely positioned.

The foregoing and other objects are achieved in a manipulator having a cradle for holding the test head. Minor adjustments can be made by moving the test head within the cradle. Large adjustments can be made by moving the cradle. A clamp is attached to the cradle to hold the cable with a slight bend between the clamp and the test head to allow easy manipulation of the test head for minor adjustments. The cradle and clamp move together as a unit.

In one embodiment, the manipulator includes an electronic control unit which controls motors and brakes attached to various members of the manipulator in response to operator inputs. In one embodiment, the manipulator includes position sensors on the test head which are connected to the control unit. The control unit uses the sensor inputs to translate directional commands given relative to the operator's frame of reference to commands in the manipulator's frame of reference.

In another embodiment, motion of the test head within the cradle is damped to avoid sudden motions of the test head upon undocking.

In yet another embodiment, the manipulator has a slight amount of compliance to allow final position adjustments of the test head to be made by a precision interface during docking.

In another embodiment, the manipulator includes an electrostatic discharge device with a heat sensor coupled to the electronic control unit. The electronic control unit disables motion of the test head unless the heat sensor indicates the electrostatic discharge device is being worn by a human.

BRIEF DESCRIPTION OF THE DRAWINGS

The invention will be better understood by reference to the following more detailed description and accompanying drawings in which.

DESCRIPTION OF THE PREFERRED EMBODIMENT

Figure 1:
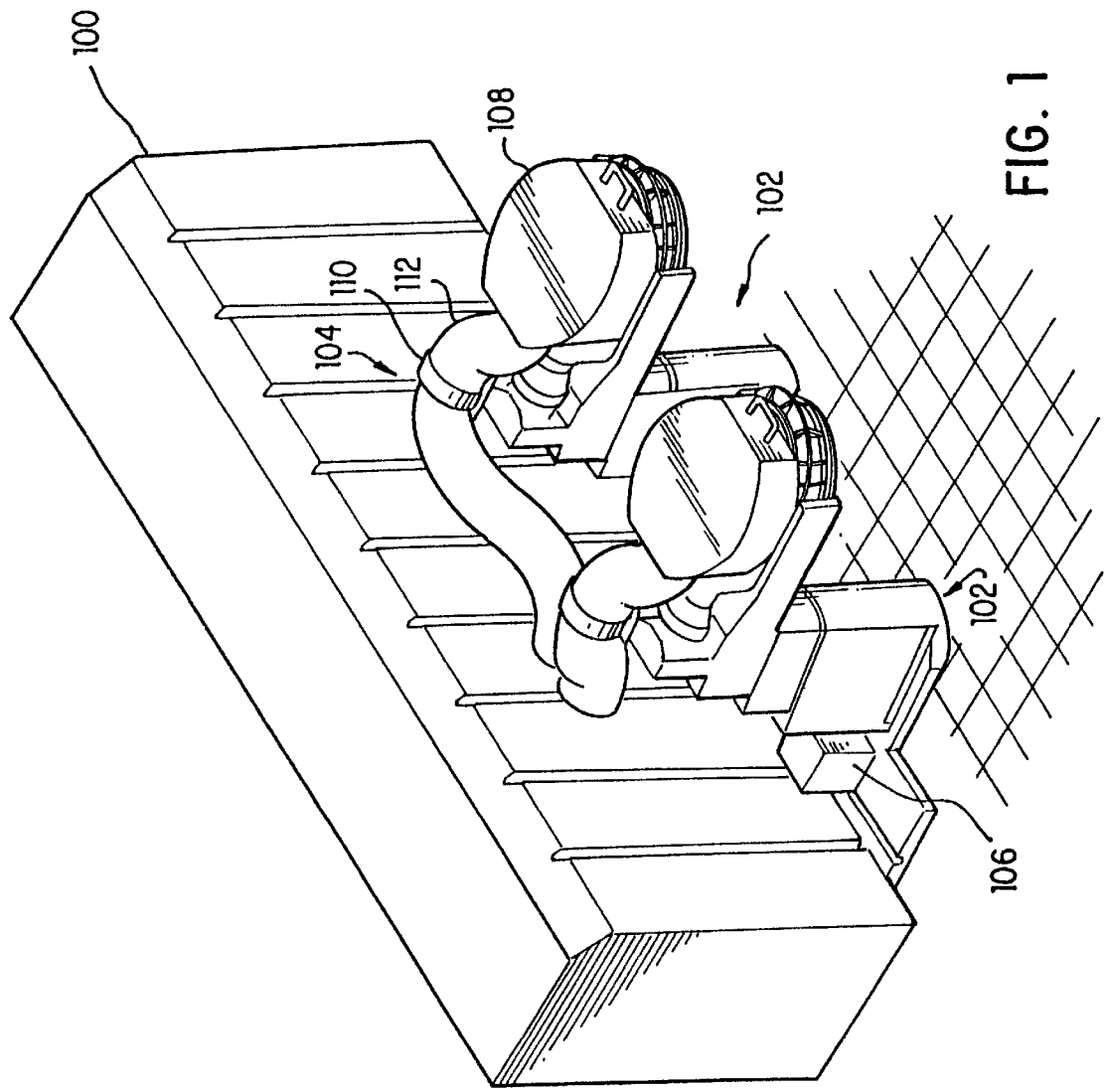
FIG. 1 is a sketch illustrating a manipulator according to the invention in use.

FIG. 1 shows a tester 100 such as might be used to test semiconductor wafers. A test head 108 interfaces, or "docks," to a prober or handling device (not shown), which positions the wafer relative to test head 108. In FIG. 1, two test heads 108 are shown, but a single test head is often used.

Each test head 108 is connected to tester 100 through cable 104. Cable 104 contains numerous wires or smaller cables. It is very inflexible and heavy.

Test head 108 is held by manipulator 102. Manipulator 102 physically supports test head 108. It also allows test head 102 to be positioned to dock with a prober or handling device (not shown). Different probers and handling devices have docking interfaces positioned differently. To enable test head 108 to dock with any type of prober or handling device, manipulator 102 must be able to move test head 108 with six degrees of freedom.

Test head 108 is very heavy, weighing as much as a thousand pounds. Manipulator 102 must support this weight while allowing test head 108 to be moved easily and accurately into position. In addition, manipulator 102 must contain features to ensure that test head 108 is prevented from falling to the ground.

To accomplish these goals, manipulator 102 allows course motion in certain directions and allows fine motions in other directions. Cable 104 is clamped in cable stirrup 110, which differentiates the fine motions from the course motions.

Cable stirrup 110 is attached to manipulator 102. It moves relative to tester 100 and the prober (not shown) when manipulator 102 moves test head 108 with a course motion. Conversely, cable stirrup 110 is fixed relative to tester 100 when manipulator 102 moves test head 108 in a fine motion. This arrangement isolates test head 108 from changes in forces exerted by cable 104 during the fine motions.

Cable 104 is clamped in cable stirrup 110 so that the length of cable 104 between cable stirrup 110 and the point of attachment of cable 104 to test head 108 is longer than the maximum distance between cable stirrup 110 and the point of cable attachment on test head 108. This arrangement ensures that cable 104 will contain bend 112 between cable stirrup 110 and test head 108. Though cable 104 is generally inflexible, bend 112 allows the portion of the cable 104 between cable stirrup 110 and test head 108 to be freely moved and allows more accurate positioning of test head 108 during fine motions.

To facilitate movement of test head 108, manipulator 102 may include motors to drive manipulator in one or more directions. These motors are controlled in a conventional fashion through electronics contained in electronics housing 106. Manipulator 102 also includes brakes which must be released before manipulator 102 can move. Conventional electronics within electronics housing 106 control these brakes. In addition, motion of manipulator 102 may be computer controlled in response to commands provided by a human operator or from commands provided by a computer controlling the operation of the test floor including tester 100 and manipulator 102. Conventional control electronics may also be included in electronics housing 106.

Electronics to control a motor or to release a brake is well known and not explicitly shown. Likewise, control algorithms for controlling motors to move an object are well known. Many such algorithms rely on sensors for feedback. Any such sensors which might be used with the manipulator of the invention are not explicitly shown. Likewise, wiring to connect the control electronics to motors and brakes is not explicitly shown, as these items are well known in the art.

Manipulator 102 holds test head away from the base (not numbered) of manipulator 102. This positioning creates a torque on manipulator 102 which might cause it to tip over. To prevent manipulator 102 from tipping over, manipulator 102 might be secured to the floor at its base. Alternatively, manipulator 102 could be counterweighted at its base. FIG. 1 shows that the base of manipulator 102 extends under tester 100. In this configuration tester 100 acts as the counter weight. If manipulator 102 is to be positioned away from tester 100, counter weights, such as iron plates, could be placed on the base of manipulator 102.

Figure 2:
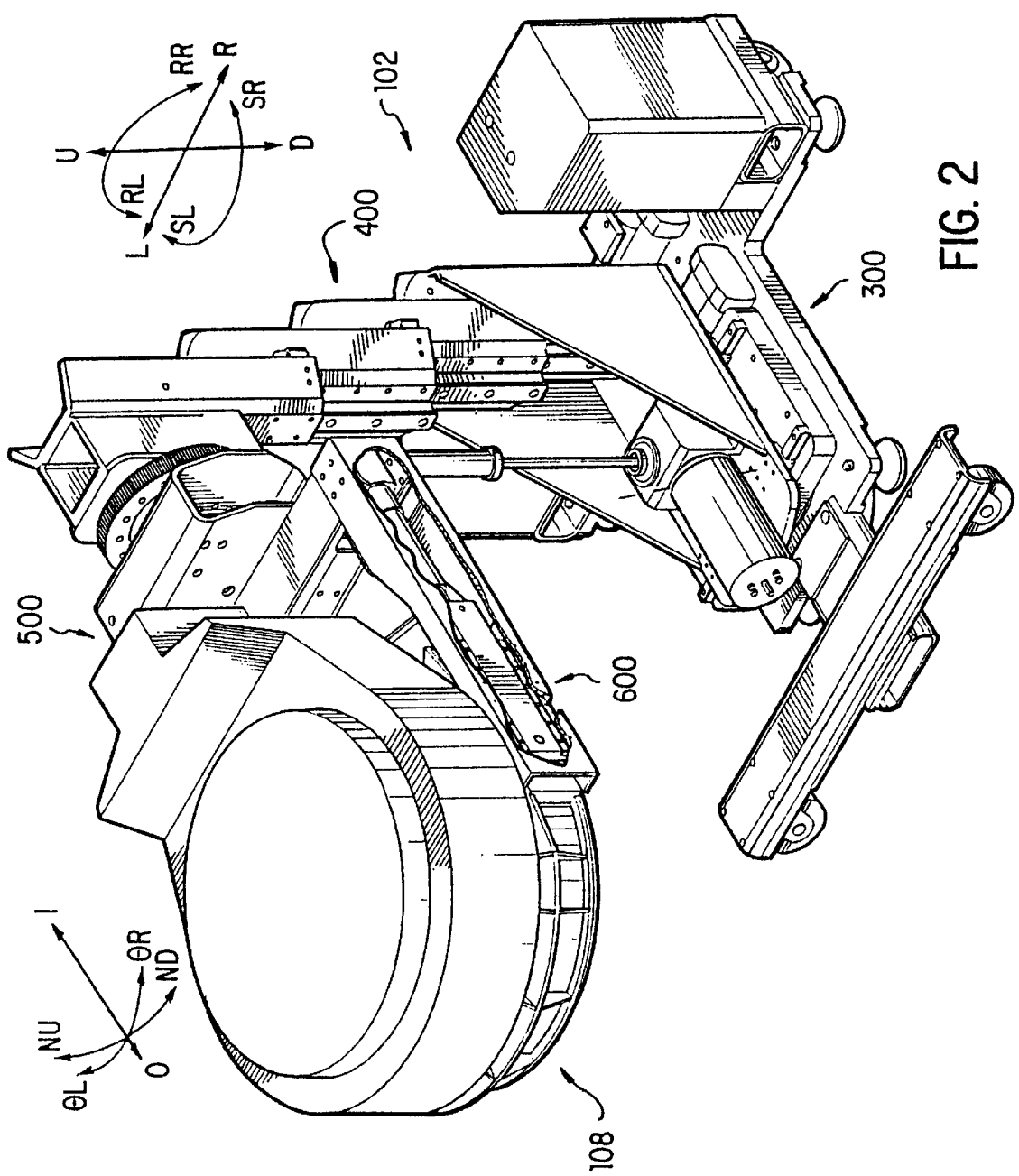
FIG. 2 is a sketch showing a manipulator according to the invention in greater detail.

Turning now to FIG. 2, manipulator 102 is shown in greater detail. Manipulator 102 is made up of several assemblies: base assembly 300, column assembly 400, twist arm assembly 500 and cradle assembly 600. These assemblies are shown in greater detail in conjunction with FIGS. 3 through 6, respectively.

FIG. 2 shows two sets of arrows, each depicting directions in which manipulator 102 can move test head 108. Arrows U-D define vertical motion. Arrows L-R define horizontal motion. Arrows SL-SR define swing motion. Arrows RL-RR define rotational motion. Vertical motion, horizontal motion, swing motion and rotational motion are course motions.

Vertical motion is provided by telescoping column assembly 400. Horizontal motion is provided by translation of column assembly 400 relative to base 300. Swing motion is provided by rotation of column assembly 400 relative to base 300. Rotational motion is provided by rotating twist arm assembly 500.

Arrows I-O define in-out motion. Arrows NU-ND define "nod" motion. Arrows $\Theta L$-$\Theta R$ define the $\Theta$ direction. In-out, nod and $\Theta$ define the fine motions.

In-out motion is provided by translation of both sides of test head 108 in cradle assembly 600. Nod motion is achieved by rotation of test head 108 about its mounting point to cradle assembly 600. Motion in the $\Theta$ direction is achieved by differential translational motion of the two sides of test head 108 relative to cradle assembly 600.

Cradle assembly 600 and portions of twist arm assembly 500 always move relative to tester 100 (FIG. 1) during the course motions but do not move relative to test head 108 during those course motions. To isolate test head 108 from changes in cable forces during course motion, cable stirrup 110 (FIG. 1) should be attached to either cradle assembly 600 or the portions of twist arm assembly 500 which do not move relative to test head 108. Attachment to twist arm assembly 500 is preferred because that assembly may be readily made to withstand cable forces.

Cable stirrup 110 (FIG. 1) is not shown explicitly in FIG. 2. Cable stirrup 110 is preferably mounted as close to column assembly 400 as possible. However, cable stirrup 110 should hold cable 104 (FIG. 1) far enough from column assembly 400 so that cable 104 clears column assembly 400 when test head is rotated. Also, as shown in FIG. 1, cable stirrup 110 is positioned to one side of column assembly 400. This allows rotation in direction RL of at least 180° and in direction RR of at least 90°. This range of motions allows test head 108 to dock with a prober or handler which has a docking surface vertically above or below or horizontally to the right or left of test head 108.

Figure 3:
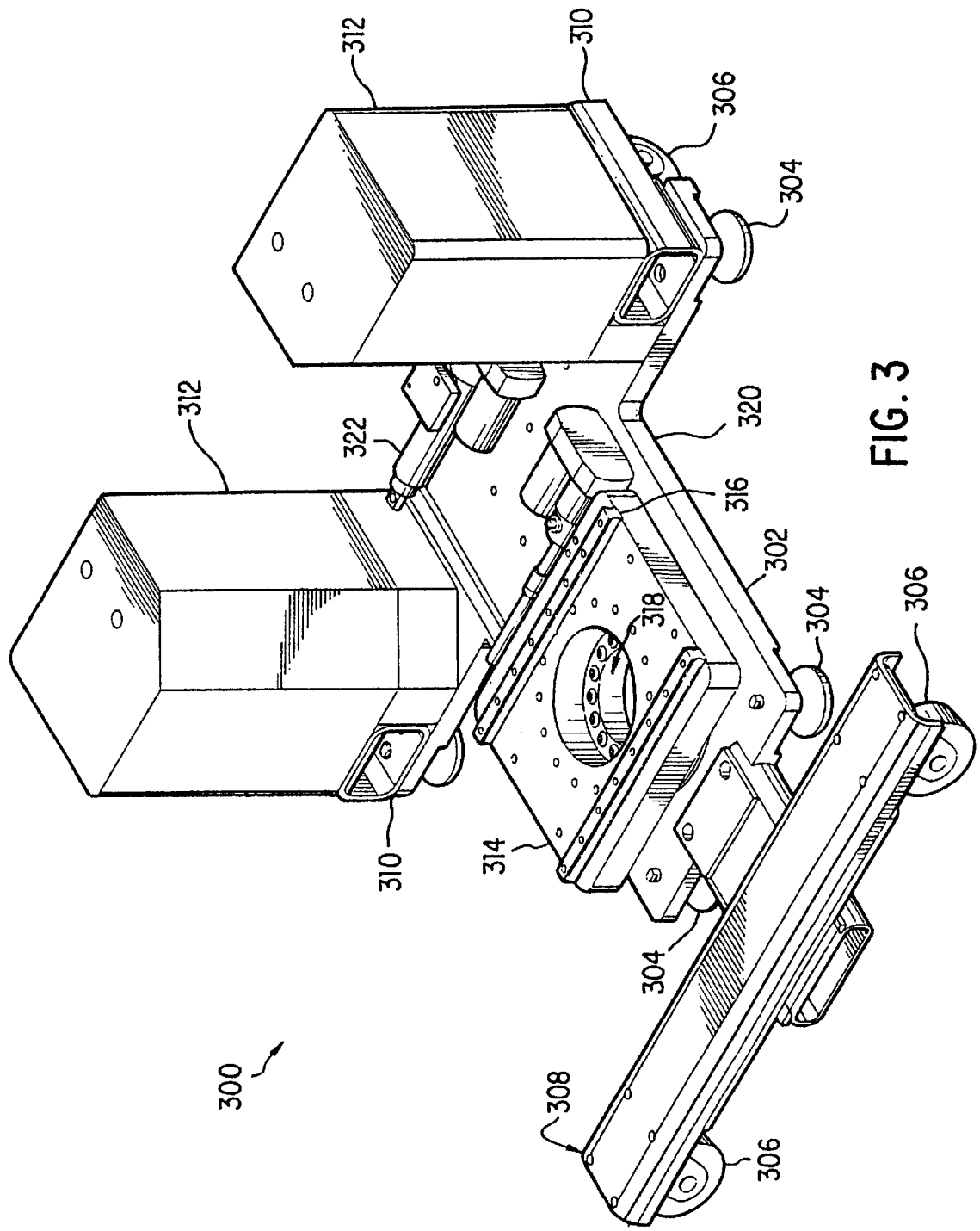
FIG. 3 is a sketch showing the base assembly of the manipulator of FIG. 2.

FIG. 3 shows base assembly 300 in greater detail. The elements of base assembly 300 are supported on base plate 302.

Feet 304 are installed on the under side of base plate 302. Feet 304 are mounted through threaded holes and may be extended or retracted. Feet 304 support manipulator 102 in a stationary position when they are extended.

Casters 306 are also installed on the under side of base plate 302 and stabilizing bar 308. When feet 304 are retracted, casters 306 contact the ground and allow manipulator 102 to be easily rolled.

Tubes 310 are positioned to the rear of base plate 302. If desired, rods (not shown) may be inserted into tubes 310 and under tester 100 (FIG. 1) to counter weight manipulator 102.

Counter weights 312 are also placed on the base plate 302. Counter weights 312 can be any heavy objects, such as stacks of steel plates.

Plate 314 is mounted to base plate 302 with a rotary bearing 318. Plate 314 carries column assembly 400 (FIG. 4). Thus, rotary bearing 318 allows swing motion.

Parallel linear rails 316 are mounted to plate 314. Linear rails 316 are adapted to receive linear bearings 402 on the column assembly 400 (FIG. 4). The combination of linear rails 316 and linear bearings 402 enables horizontal motion.

Motor assembly 320 is connected to drive column assembly 400 relative to plate 314. Motor assembly 320 includes a ball screw which extends and retracts when driven, thereby imparting linear motion. Use of such a motor is optional.

Motor assembly 322 is used as a brake for swing motion. Motor assembly 322 also includes a ball screw which extends and retracts when driven. The ball screw connects to a belt (not shown) which loops around bearing 318. As motor assembly 322 is driven, the belt tightens or loosens and thereby applies or releases a brake for swing motion.

Motor assembly 322 is also optional. A brake might also be implemented by a having an outer surface of rotary bearing 318 formed with teeth. A spring loaded solenoid might then be used to press a "short rack" into the teeth or to retract the short rack. The short rack is a toothed segment which does not rotate. When pressed against a toothed bearing, it will prevent the bearing from rotating. However, if sufficient force, for example in excess of 30 pounds, of force is applied, there will be slippage between the short rack and the rotary bearing. In this way, compliance is provided in the swing direction.

Figures 4A, 4B:
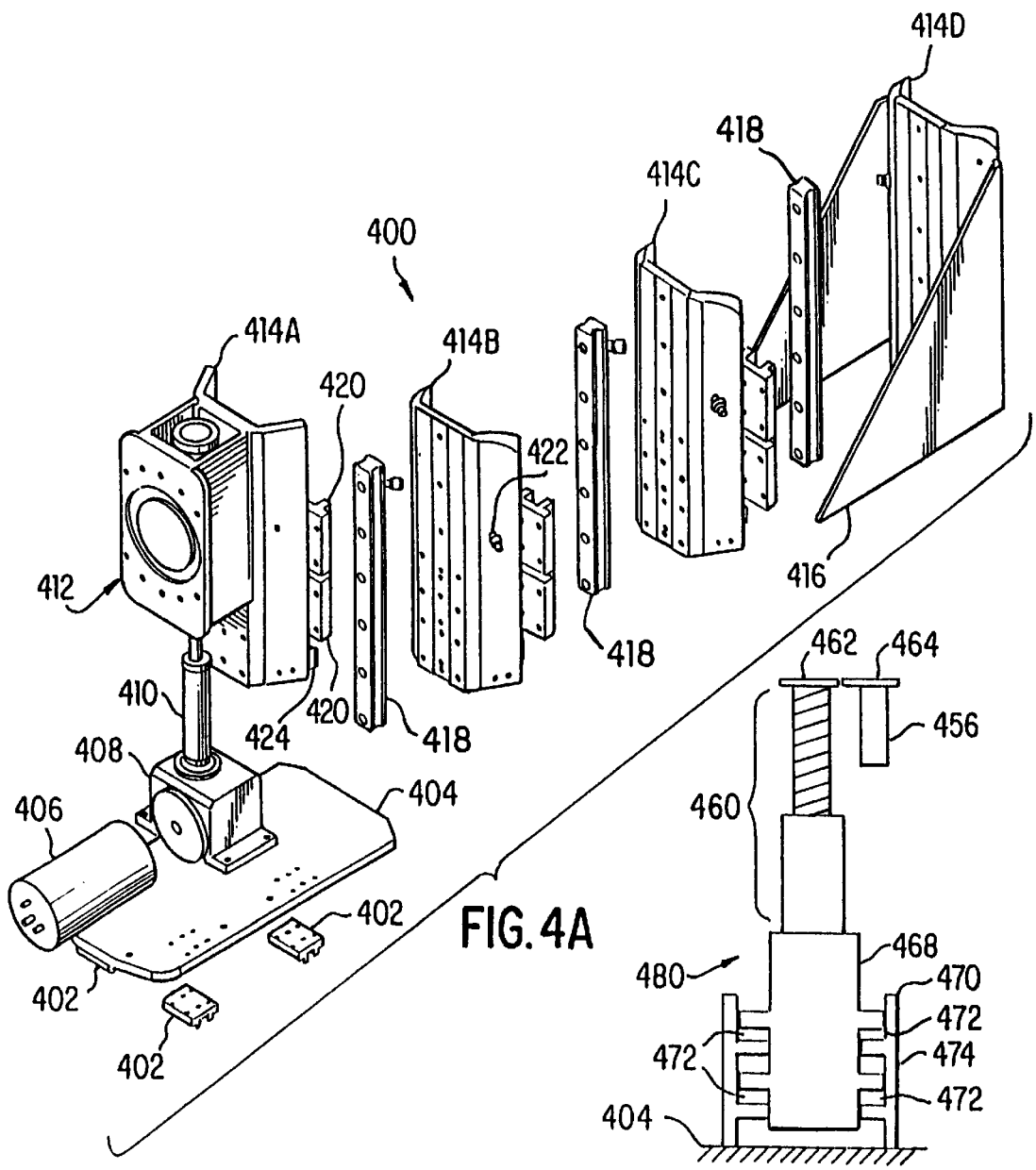
FIG. 4A is a sketch showing the column assembly of the manipulator of FIG. 2.
FIG. 4B is a sketch showing a cross sectional view of a compliant drive mechanism for the column assembly of FIG. 4A.

FIG. 4A shows column assembly 400 in exploded view. Column assembly 400 is built on column base plate 404. Linear bearings 402 are mounted on the lower side of column base plate 404 to provide horizontal motion as described above.

Column assembly 400 includes a plurality, here four, of parallel column segments 414. Column segment 414D has stabilizing wings 416 mounted on its two sides. Column segment 414D is attached to column base plate 404 as are stabilizing wings 416. Column segment 414D is mounted perpendicular to column base plate 404.

A linear rail 418 is mounted on the front face of column segment 414D. Linear bearings 420 are mounted on the rear face of column segment 414C and engage linear rail 418. This allows column segment 4141C to slide vertically relative to column segment 414D.

Linear rails 418 and linear bearings 420 are likewise employed between column segments 414C and 414B as well as between column segments 414B and 414A. Column segments 414C, 414B and 414A are not fixed to column base plate 404. However, column segments 414A, 414B and 414C can be moved vertically downwards until they reach column base plate 404. Column segments 414A, 414B and 414C can also be moved vertically upwards. In this way, column assembly 400 can be collapsed or expanded in a telescoping fashion.

Upward vertical motion of column segment 414C is limited by stop pins 422 on column segment 414D that engage stop tabs 424 on the rear surface of column segment 414C. Upward vertical motion of column segments 414B is limited by stop pins 422 on column segment 414C. Upward motion of column segment 414A is likewise limited by stop tabs on column segment 414B. Overall, column assembly 400 may be extended to approximately twice its collapsed height. For example, column assembly might telescope from a height of three feet to a height of about six feet. In this way, vertical motion is provided.

Column segments 414 are shaped to be non-planar. This shape provides greater stability to column assembly 400. It also allows the column segments to nest together, thereby reducing the size of the assembly. However, any shape might be used.

Figure 5:
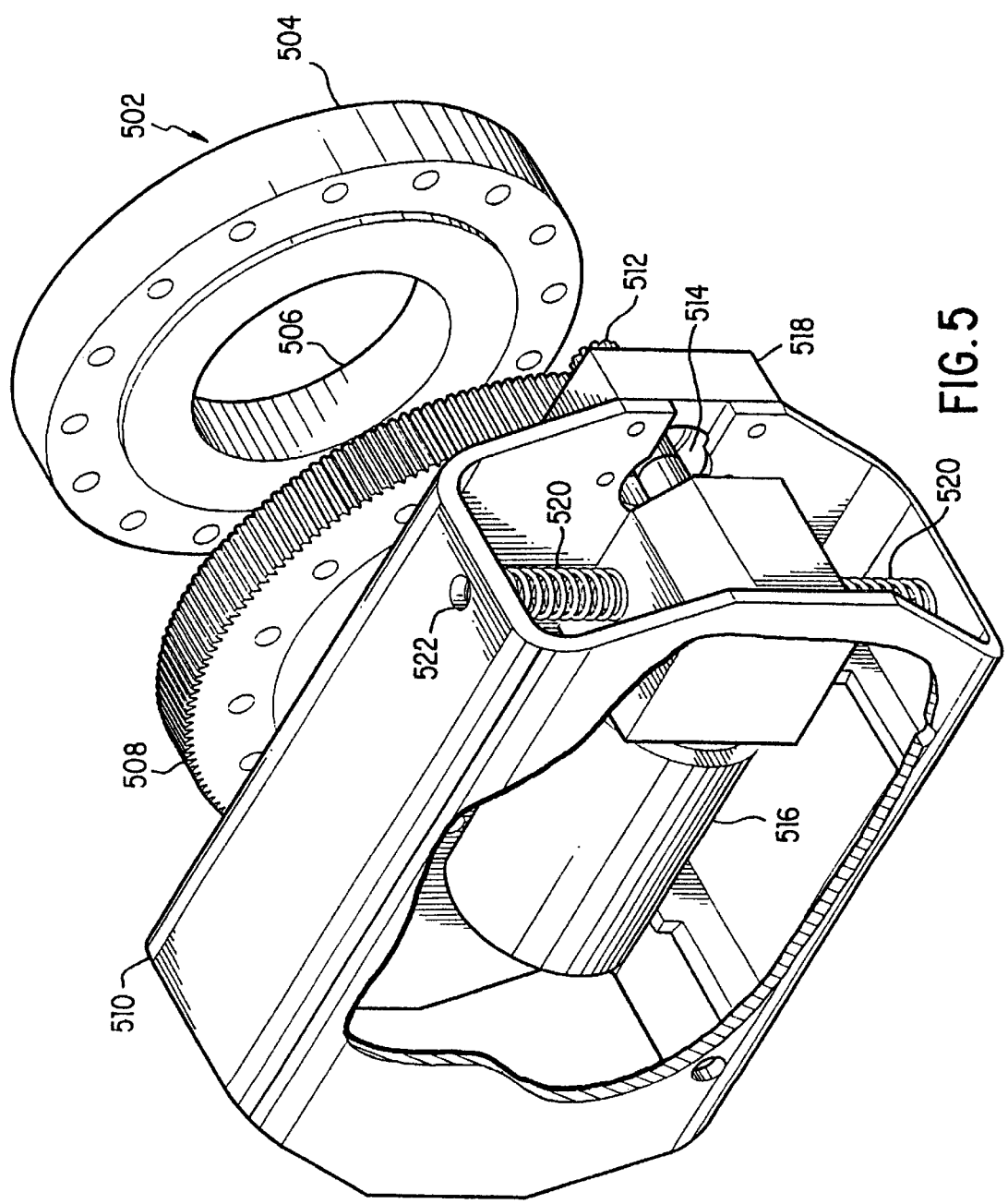
FIG. 5 is a sketch showing the twist arm assembly of the manipulator of FIG. 2.

Mounting plate 412 is attached to column segment 414A. Mounting plate 412 provides a place of attachment for twist arm assembly 500 (FIG. 5). The upper end of acme screw 410 is also attached to mounting plate 412.

The lower end of acme screw 410 is connected to transmission 408 which is attached to column base plate 404. Transmission 408 is driven by motor 406. When motor 406 is activated, transmission 408 will rotate acme screw 410.

Acme screw 410 is made of telescoping sections. Rotation of acme screw 410 causes the screw to extend or retract. In this way, column assembly 400 is motorized to extend or retract.

Acme screw 410 has threads with sufficient friction that it will not retract under the weight attached to mounting plate 412. It will only retract when driven by motor 406. The vertical motion is "nonbackdrivable." Nonbackdrivable means that, even if the drive force is removed, there is no motion.

FIG. 4B shows in cross section an alternative embodiment of the drive mechanism for column assembly 400. The drive mechanism of FIG. 4B replaces motor 406, transmission 408 and acme screw 410 of FIG. 4A.

In place of acme screw 410, ball screw 460 is used. Ball screw 460 is also a telescoping screw but has lower friction than acme screw 410 and may therefore be driven with a smaller motor.

The upper end of ball screw 460 contains a gear 462. Gear 462 connects to gear 464, which is mounted to the shaft of motor 456. In this way, rotary motion is coupled from motor 456 to ball screw 460. The upper end of ball screw 462 is mounted to column segment 414A so that it extends and retracts the column when driven. Where ball screw 462 is used in place of an acme screw, motor 456 must include a brake to ensure that the vertical axis is non-backdrivable.

The lower end of ball screw 460 is mounted on an air piston assembly 480 made up of an inner cylinder 468 and an outer cylinder 470. Inner cylinder 468 has outwardly directed projections and outer cylinder 470 has inwardly directed projections. These projections make an almost air tight seal on their ends to form cavities 472. However, the seals still allow relative motion of inner cylinder 468 and outer cylinder 470.

Cavities 472 are pressurized to a constant pressure, such as through a regulator (not shown). A pressure in the range of 40 to 60 pounds per square inch is preferably maintained in each cavity. Cavity 474 is not pressurized and is vented to avoid unduly restricting motion of the inner cylinder 468 relative to outer cylinder 470.

Outer cylinder 470 is attached to column base plate 404. When sufficient force is applied along the vertical axis, inner cylinder 468 moves relative to outer cylinder 470. In this way, air piston assembly 480 provides some compliance to manipulator 102 along the vertical axis.

FIG. 5 shows a partially exploded view of twist arm assembly 500. Twist arm 500 is attached to mounting plate 412 (FIG. 4) through rotary bearing assembly 502. Rotary bearing assembly 502 has an outer ring 504 and an inner ring 506 which rotate freely with respect to each other.

Outer ring 504 is attached to mounting plate 412. Inner ring 506 is attached to tube 510. Where necessary, a shaft or extension member is used to span the distance between inner ring 506 and tube 510. Rotary bearing assembly 502 allows tube 510 to rotate, thereby providing rotational motion.

Gear 508 is fixed to outer ring 504. Gear 512 engages gear 508. Gear 512 is connected through shaft 514 to motor 516. Motor 516 is mounted inside tube 510. Shaft 514 is supported by bearing block 518, which is mounted to tube 510.

When activated, motor 516 drives tube 510 to rotate. In this way, rotational motion is driven. Motor 516 incorporates a clutch assembly. If motor 516 is not activated, the clutch assembly prevents motion of shaft 514. In this way, rotational motion is nonbackdrivable.

Motor 516 is mounted on springs 520 and not rigidly attached to tube 510. Springs 520 are held in place by pins (not shown) through holes 522. This mounting allows motor 516 to rotate about shaft 514 if a sufficient force is applied. Preferably, motor 516 can rotate approximately 20°. Based on the gearratio between gears 508 and 512, this rotation translates into rotation of tube 510 of approximately 2°. This slight amount of rotation provides compliance in the rotational direction.

Cable clamp 110 (FIG. 1) is not explicitly shown in FIG. 5. However, a cable clamp could be easily mounted to tube 510.

Figure 6:
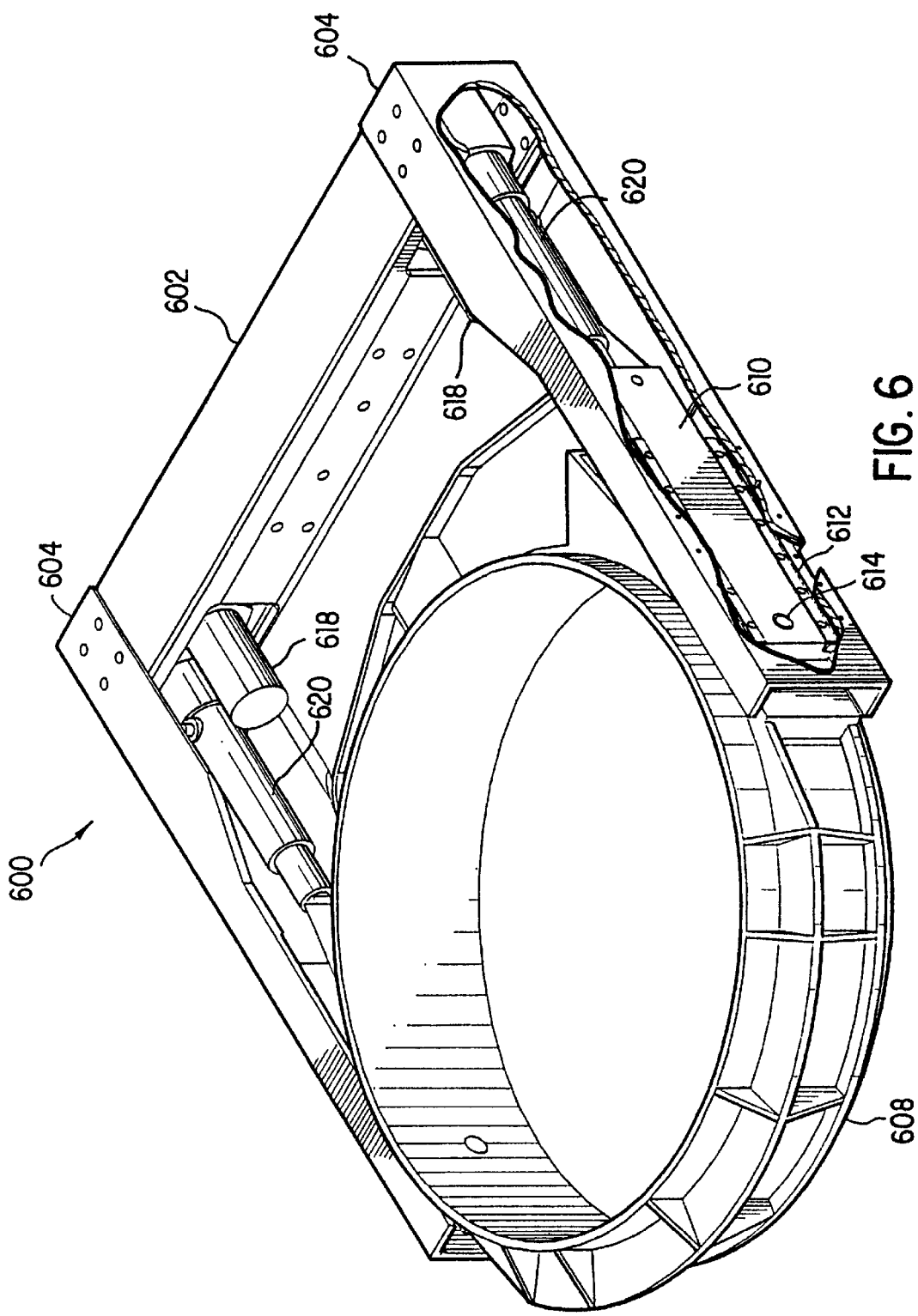
FIG. 6 is a sketch showing the test head cradle of the manipulator of FIG. 2.

Tube 510 provides a mounting point for cradle assembly 600. FIG. 6 shows cradle assembly 600 holding test head frame 608. In use, test head frame 608 would support the electronics which make up test head 108 (FIG. 1).

Back 602 is attached to tube 510 (FIG. 5). Side arms 604 extend from back 602. Each side arm 604 is U-shaped and contains the mechanism which allows all of the fine motions. The mechanism is the same in each side arm 604.

Each side arm 604 includes a pair of rails 612 along the length of the side arm 604. Carriage 610 rides on rails 612.

Test head frame has bolts 614 extending from it. These bolts, which extend out from test head 108, are threaded at one end to allow rigid attachment to test head frame 608. They are unthreaded at the end projecting into side wall 604.

The unthreaded end of bolt 614 is connected to carriage 610 through a rotary joint (not numbered) formed by a spherical plane bearing, such as part number 6Sf10 from the Torrington Company. When carriages 610 in each side arm 604 move together, in/out motion is provided.

The rotary joint allows bolt 614 to rotate around its axis. The rotation provides nod motion.

The rotary joint also allows bolt 614 to pivot relative to carriage 610 in a plane perpendicular to the surface of carriage 610. This motion also makes it possible for carriages 610 in opposite side arms 604 to move in different directions simultaneously. This differential movement provides Θ motion.

When carriages 610 move in opposite directions, the distance between carriages 612 changes. To account for this change in distance, the bearing connecting bolt 614 to carriage 610 in one of the side arms could allow bolt 614 to slide perpendicular to the surface of carriage 610.

In a preferred embodiment, motion of bolt 614 perpendicular to the surface of carriage 610 is not directly allowed. Rather side arms 604 are made to be slightly flexible. During Θ motion, side arms 604 flex together, keeping the distance between carriages 610 constant. Even though side arms 604 are preferably made from steel or other relatively stiff material, their long shape gives them the small amount of flexibility required to allow Θ motion. A steel channel piece six inches high by two inches deep and 0.3 inches thick is suitable. A similar sized aluminum piece might also be used for lighter weight.

Each side arm 604 includes a motor 618. Motor 618 is coupled to carriage 610 in a conventional means, such as through a belt (not shown). Motors 618 can drive in/out motion and Θ motion. In a preferred embodiment, motors 618 are stepper motors coupled to carriage 610 through a ball screw. Stepper motors allow open loop control and eliminate the need for positional feedback sensors.

Motors 618 include a clutch mechanism, which must be released in order to move carriages 610. Preferably, the clutch mechanism of motors 618 can be released without driving the motors 618. This allows test head 108 (FIG. 1) to be moved in a compliant mode for the in/out and Θ directions.

Nod motion (rotation about the axis of bolts 614) is not motor driven. Generally, bolts 614 will be mounted near the center of gravity of test head 108. Thus, despite the weight of test head 108, little force will be required for nod motion. Nod motion is always in a compliant mode.

As shown in FIG. 1, cable 104 restricts the amount of nod motion which is possible. In a preferred embodiment, nod motion is constrained, such as through stops (not shown) to be no more than approximately +/−2°. Test head 108 might be spring biased in the nod direction to return to a neutral position.

In/out and Θ motion present a unique problem for motor driven control. Because cradle assembly 600 can rotate, the absolute directions of in/out and Θ motion can change. Because the directions can change, the direction of gravitational forces relative to these motions can change. When the clutch of motors 618 is released, it is possible that test head 108 (FIG. 1) will move due to gravitational forces. Because the direction of the gravitational forces can change, the direction in which motors 618 must drive each of the carriages 610 to counter the gravitational forces is not always the same.

To avoid having test head 108 damaged due to sudden motion when the clutches of motors 618 are released, each side arm 604 includes an air damper 620. When the clutches of motors 618 are released, test head 108 (FIG. 1) might move, but its movement will be very slow so that there is reduced chance the test head 108 will be damaged.

Manipulator 102 is assembled using strong materials generally used in precision machine designs. The structural members are shaped from steel or similar material using well known manufacturing techniques. For example, base plate 302 is formed from a 1.5" steel plate and column segments 414 are 0.75" steel plates. Bearing assemblies and rails are commercially available. Any good quality bearing capable of supporting the weight of test head 108 may be used.

Any known assembly techniques may be used. Steel pieces may be joined by welding or by bolts or screws. It is preferable that at least some pieces be joined by screws to allow for easy transport of manipulator 102. Preferably, twist arm assembly 500 is attached to column assembly 400 with screws to allow manipulator 102 to be broken into pieces for easy transport.

It is envisioned that manipulator 102 will be used in conjunction with a test head/prober interface which provides precise positioning. An example of such an interface is described in U.S. patent application Ser. No. 08/299,831 for Interface Apparatus For Automatic Test Equipment filed Sep. 1, 1994 (which is hereby incorporated by reference). That patent application defines an interface in which posts on the prober are grasped by a mechanism on the test head. The mechanism pulls on the posts, thereby pulling the test head and prober together. The mechanism is shaped so that as the test head is pulled toward the prober, it is properly positioned.

In use, it is envisioned that manipulator 102 will include a control mechanism, such as a set of joy sticks, connected to electronics housing 106 (FIG. 1). The joy stick is used to provide control inputs to the control electronics. Preferably, one joy stick will be used to control course motion and one will be used to control fine motion. Control algorithms to translate joystick control inputs to motor control signals are well known.

For example, the course motion controls might first be used to position test head 108. Then fine motion controls would be used to bring test head 108 close enough to the prober that the precise positioning mechanism at the prober/test head interface could be engaged. Once the precise positioning mechanism is engaged, it is necessary that manipulator 102 be placed into a compliant mode.

Manipulator 102 is placed in a complaint mode by releasing the clutches of motors 320 and 322 to provide compliance in the swing and horizontal directions. Compliance can be provided in the in/out and Θ directions by releasing the brakes on motors 618. As discussed above, a slight amount of compliance is also provided by the inherent flexibility of side arms 604 and other structural members. Compliance in the vertical direction is provided by air cylinder 480 and in the rotation direction through spring mounting of motor 516. Compliance in the nod direction is provided because, within limits, the test head is free to rotate in the nod direction. The compliance allows the precise positioning mechanism to pull test head 108 into the precise position required for docking the test head to the prober.

Once docked, the clutches of motors 320, 322 and 516 are then engaged to hold test head 108 in the required position.

Having described one embodiment, numerous alternative embodiments or variations might be made. For example, FIG. 5 shows that gear 508 is attached to rotary bearing 502. The outer surface of rotary bearing 502 might be toothed to eliminate the need for a separate gear.

Further, it was described that the manipulator was constructed to give compliance in various directions. Compliance is useful in docking with a prober or other device that contains an interface which positions the test head relative to the prober. Where such an external positioning device is not used, it might be preferable to build a manipulator without compliance.

For example, not all motions need to be motor driven. Motors are used to make test head 108 easier to move. Swing motion does not have to counter the effects of gravity or cable forces and might therefore not need to be motor driven. Likewise, because the fine motions are isolated from cable forces, it is possible to eliminate motors 618.

However, even if motors are eliminated, it will be preferable to still use some clutch mechanism to prevent unwanted motion.

Where motors are eliminated, it might be desirable to mount handles on test head 108 or elsewhere on manipulator 102 to provide easy movement. Such handles might include control buttons to release the clutch mechanisms.

Even if motors are used, it might be desirable to use handles on the test head 108 and manipulator 102. Such handles could include force sensors which could be used to provide control inputs instead of a joystick controller.

Further, it might be desirable to equip test head 108 with position sensors. The position sensors would be used to translate control inputs to motor commands which caused motion of the test head relative to the coordinate space of the operator.

If position sensors are used, air damper 620 might be eliminated. When undocking the test head, the position of the test head might first be sensed. Before undocking, motors 618 would be activated to counter any motion of test head 108.

Use of motorized controls in conjunction with control electronics provides the opportunity to add many features to manipulator 102. For example, the joy stick controller might be replaced with a set of buttons on a wrist band, resembling a wrist watch. The wrist band would also serve as a grounding device to prevent electrostatic discharge. The wrist band might also contain a temperature sensor which would detect whether the band was being worn by a person. If the band were not being worn, control functions on the manipulator might be disabled. In this way, the test head could not be moved unless the operator were properly grounded to avoid electrostatic discharge. Such a sensor might be incorporated into other types of electrostatic discharge devices.

A further embodiment is to include light beams as an aid in docking the test head to a prober. One or more light beams might be emitted from specific points on the underside of the test head. Markers would be included on the prober to indicate specific points on the prober which should align with those points on the test head. By observing the relationship between the light beams and the markers, an operator could tell in which direction the test head needs to be moved for proper docking. Additionally, the light beams could be focused in a plane a fixed distance from the test head. When the test head is positioned such that the prober surface is in this plane, all of the light beams will be sharply focused. If some of the light beams are more sharply focused than others, it indicates that the test head is tilted relative to the prober. Thus, by observing the position and intensity of the light beams, an operator could accurately position the test head.

FIG. 2 shows that twist arm assembly 500 is mounted symmetrically to mounting plate 412. Asymmetrical mounting of twist arm assembly 500 could be used to move test head 108 closer to a prober on one side of manipulator 102.

Further, while the preferred embodiment was described in terms of a test head for automatic test equipment, the manipulator of the invention might be used to position any type of test head or even other heavy objects which must be precisely positioned. The invention will be particularly useful with heavy devices which need precise positioning even though they are connected to a cable.

Therefore, the invention should be limited only by the spirit and scope of the appended claims.

What is claimed is:

1. A manipulator for use in a test system of the type having a tester body, a test head and a cable connecting the tester body to the test head, comprising:
   a) a telescoping shaft having a distal portion;
   b) a rotating member attached to the shaft at its distal portion, said rotating member adapted to have a test head coupled thereto; and
   c) a clamp, adapted to hold the cable, coupled to the rotating member.

2. The manipulator of claim 1 wherein the clamp extends from the rotating member a distance sufficient to hold the cable away from the telescoping shaft as the rotating member is rotated through an angle of at least 90°.

3. The manipulator of claim 1 wherein the clamp extends from the rotating member a distance sufficient to hold the cable away from the telescoping shaft as the rotating member is rotated through an angle of at least 180°.

4. The manipulator of claim 1 wherein the clamp extends from the rotating member a distance sufficient to hold the cable away from the telescoping shaft as the rotating member is rotated through an angle of at least 270°.

5. A manipulator for a test head which is connected to one end of a cable comprising:
   a) means for supporting the test head and for allowing fine motion of the test head in at least one direction, the means for supporting comprising
      i) a pair of arms;
      ii) a plurality of carriages, each of the carriages slidably attached to one of the arms; and
      iii) wherein the test head is connected to each of the plurality of carriages;
   b) a clamp, coupled to the means for supporting the test head, said clamp connected to the cable at a point spaced from the end of the cable connected to the test head by a distance which is greater than the distance between the clamp and the test head; and
   c) means, coupled to the means for supporting the test head, for allowing coarse motion of the test head in at least one direction;
   d) wherein the test head is connected to at least one of the carriages with a spherical joint.

6. The manipulator of claim 5 wherein the test head is mounted to at least one of the carriages with a joint which allows rotation of the test head in the plane defined by the arms.

7. The manipulator of claim 5 additionally comprising means for slidably moving the carriages relative to the arms in the same direction or in opposite directions.

8. The manipulator of claim 5 wherein the means for allowing course motion comprises
   a) a vertical shaft; and
   b) a rotating member rotatably attached to the vertical shaft, wherein the means for holding the test head is connected to the rotating member.

9. The manipulator of claim 8 wherein the rotating member rotates about an axis perpendicular to the vertical shaft.

10. The manipulator of claim 9 wherein the clamp is attached to the rotating member.

11. The manipulator of claim 10 wherein the vertical shaft comprises a telescoping vertical shaft and the clamp extends above the telescoping vertical shaft in at least one position of the rotating member.

12. The manipulator of claim 8 wherein the means for allowing course motion additionally comprises a base, and wherein the vertical shaft is coupled to the base through a rotary joint.

13. The manipulator of claim 12 wherein the means for allowing course motion additionally comprises
   a) a support member coupled to the vertical shaft through said rotary joint; and
   b) a linear bearing coupling the support member to the base.

14. The manipulator of claim 5 wherein the test head is mounted to the carriages at joints which rotate about the axis defined by the points at which the test head is attached to the carriages.

15. A manipulator for a test head comprising:
   a) a base;
   b) a vertical shaft mounted to the base;
   c) a horizontal member extending from the vertical shaft, the horizontal member being movable relative to the base, the horizontal member adapted for supporting the test head; and
   d) at least one means for allowing compliant motion of the test head
   e) means for driving the test head in a vertical direction and wherein the means for allowing compliant motion comprises a compliant mounting between the means for driving and the base; and
   f) wherein the compliant mount comprises an air cylinder.

16. A manipulator for a test head comprising:
   a) a telescoping vertical shaft;
   b) a support member;
   c) a rotary bearing connected to the telescoping vertical shaft and the support member; and
   d) a cradle assembly comprising means for supporting the test head at two points, which points can be moved in the same direction to allow translation of the test head in a plane including the two points and can be moved in opposite directions to allow rotation in the plane including the two points.

17. The manipulator of claim 16 wherein the means for supporting the test head at two point comprises:
   a) two spherical joints, each slidably mounted to the cradle assembly; and
   b) two shafts, each extending from the test head at one of the two points and engaging one of the spherical joints.

18. The manipulator of claim 17 wherein the means for supporting additionally comprises two motors mounted to the cradle assembly and coupled to the spherical joints.

19. The manipulator of claim 18 wherein the motors comprise stepper motors.

20. A manipulator for a test head comprising:
   a) a base;

b) a vertical shaft mounted to the base;

c) a horizontal member extending from the vertical shaft, the horizontal member being movable relative to the base, the horizontal member adapted for supporting the test head; and d) a compliant member disposed between the base and the vertical shaft.

21. The manipulator of claim 20 additionally comprising means for driving the test head in a vertical direction and wherein the compliant member comprises a compliant mounting between the means for driving and the base.

22. The manipulator of claim 20 wherein the means for compliant motion comprises a compliant rotary joint between the horizontal member and the vertical shaft.

23. The manipulator of claim 22 wherein the compliant member comprises:

a) a first geared segment mounted to the vertical shaft;

b) a second geared segment engaging the first geared segment;

c) a shaft holding the second geared element; and d) a member fixedly attached to the shaft and projecting perpendicular to the shaft; and e) a spring mounting the perpendicular member to the horizontal member.

24. The manipulator of claim 23 wherein the spring mounting the perpendicular member allows movement of the vertical member through an arc about the shaft.

25. The manipulator of claim 23 wherein the first gear segment has a perimeter larger than the perimeter of the second gear segment.

26. The manipulator of claim 23 wherein gear ratio of the first gear segment to the second gear segment is in excess of 5 to 1.

* * * * *